United States Patent
Lei et al.

US 6,729,824 B2
(10) Patent No.: US 6,729,824 B2
(45) Date of Patent: May 4, 2004

(54) DUAL ROBOT PROCESSING SYSTEM

(75) Inventors: Lawrence C. Lei, Milpitas, CA (US); Moris Kori, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 66 days.

(21) Appl. No.: 10/017,039

(22) Filed: Dec. 14, 2001

(65) Prior Publication Data

US 2003/0113187 A1 Jun. 19, 2003

(51) Int. Cl.⁷ .............................. B65G 49/07
(52) U.S. Cl. ...................... 414/217; 414/939
(58) Field of Search ............ 414/217, 222.07, 414/222.08, 222.13, 226.03, 226.05, 939

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Matsumoto | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,923,584 A * | 5/1990 | Bramhall et al. | 204/298.25 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |

(List continued on next page.)

FOREIGN PATENT DOCUMENTS

| | | | | |
|---|---|---|---|---|
| EP | 0 344 352 A1 | 6/1988 | | H01L/39/24 |
| EP | 0429270 | 5/1991 | | G03F/7/36 |
| EP | 0 442 290 A1 | 8/1991 | | A01B/29/06 |

(List continued on next page.)

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

(List continued on next page.)

*Primary Examiner*—James W. Keenan
(74) *Attorney, Agent, or Firm*—Moser Patterson & Sheridan

(57) ABSTRACT

A substrate processing system having a transfer chamber having two processing chambers and two load lock chambers coupled thereto is generally provided. The transfer chamber includes a body having a first transfer area and a second transfer area defined therein on either side of a center axis. A first passage couples one of the load locks with the first transfer area and a second passage couples the other one of the load locks with the second transfer area. The first passage and the second passage form an acute angle about the center axis. A transfer platform is disposed between the first transfer area and the second transfer area. A first transfer robot and a second transfer robot are disposed in the first and second transfer areas, respectively. Each robot is adapted to transfer substrates between the load locks, the transfer platform and a processing chamber.

45 Claims, 9 Drawing Sheets

U.S. PATENT DOCUMENTS

| | | | | |
|---|---|---|---|---|
| 4,993,357 A | 2/1991 | Scholz | | 118/715 |
| 5,000,113 A | 3/1991 | Wang et al. | | 118/723 |
| 5,013,683 A | 5/1991 | Petroff et al. | | 437/110 |
| 5,019,233 A | * 5/1991 | Blake et al. | | 204/192.12 |
| 5,082,798 A | 1/1992 | Arimoto | | 437/108 |
| 5,085,885 A | 2/1992 | Foley et al. | | 477/38 |
| 5,091,320 A | 2/1992 | Aspnes et al. | | 437/8 |
| 5,130,269 A | 7/1992 | Kitahara et al. | | 437/111 |
| 5,166,092 A | 11/1992 | Mochizuki et al. | | 437/105 |
| 5,186,718 A | 2/1993 | Tepman et al. | | 29/25.01 |
| 5,200,017 A | 4/1993 | Kawasaki et al. | | 156/345 |
| 5,205,077 A | 4/1993 | Wittstock | | 51/165 R |
| 5,225,366 A | 7/1993 | Yoder | | 437/108 |
| 5,234,561 A | 8/1993 | Randhawa et al. | | 204/192.38 |
| 5,246,536 A | 9/1993 | Nishizawa et al. | | 156/610 |
| 5,250,148 A | 10/1993 | Nishizawa et al. | | 156/611 |
| 5,254,207 A | 10/1993 | Nishizawa et al. | | 156/601 |
| 5,256,244 A | 10/1993 | Ackerman | | 156/613 |
| 5,259,881 A | 11/1993 | Edwards et al. | | 118/719 |
| 5,270,247 A | 12/1993 | Sakuma et al. | | 437/133 |
| 5,278,435 A | 1/1994 | Van Hove et al. | | 257/184 |
| 5,281,274 A | 1/1994 | Yoder | | 118/697 |
| 5,286,296 A | 2/1994 | Sato et al. | | 118/719 |
| 5,290,748 A | 3/1994 | Knuuttila et al. | | 502/228 |
| 5,294,286 A | 3/1994 | Nishizawa et al. | | 156/610 |
| 5,296,403 A | 3/1994 | Nishizawa et al. | | 437/133 |
| 5,300,186 A | 4/1994 | Kitahara et al. | | 156/613 |
| 5,311,055 A | 5/1994 | Goodman et al. | | 257/183 |
| 5,316,615 A | 5/1994 | Copel | | 117/95 |
| 5,316,793 A | 5/1994 | Wallace et al. | | 427/248.1 |
| 5,330,610 A | 7/1994 | Eres et al. | | 117/86 |
| 5,336,324 A | 8/1994 | Stall et al. | | 118/719 |
| 5,338,389 A | 8/1994 | Nishizawa et al. | | 117/89 |
| 5,348,911 A | 9/1994 | Jurgensen et al. | | 117/91 |
| 5,357,115 A | 10/1994 | Asakawa et al. | | 250/442.11 |
| 5,374,570 A | 12/1994 | Nasu et al. | | 437/40 |
| 5,395,791 A | 3/1995 | Cheng et al. | | 437/105 |
| 5,438,952 A | 8/1995 | Otsuka | | 117/84 |
| 5,439,876 A | 8/1995 | Graf et al. | | 505/447 |
| 5,441,703 A | 8/1995 | Jurgensen | | 422/129 |
| 5,443,033 A | 8/1995 | Nishizawa et al. | | 117/86 |
| 5,443,647 A | 8/1995 | Aucoin et al. | | 118/723 ME |
| 5,455,072 A | 10/1995 | Bension et al. | | 427/255.7 |
| 5,458,084 A | 10/1995 | Thorne et al. | | 117/89 |
| 5,469,806 A | 11/1995 | Mochizuki et al. | | 117/97 |
| 5,480,818 A | 1/1996 | Matsumoto et al. | | 437/40 |
| 5,483,919 A | 1/1996 | Yokoyama et al. | | 117/89 |
| 5,484,664 A | 1/1996 | Kitahara et al. | | 428/641 |
| 5,486,080 A | * 1/1996 | Sieradzki | | 414/217 |
| 5,503,875 A | 4/1996 | Imai et al. | | 427/255.3 |
| 5,521,126 A | 5/1996 | Okamura et al. | | 437/235 |
| 5,527,733 A | 6/1996 | Nishizawa et al. | | 437/160 |
| 5,532,511 A | 7/1996 | Nishizawa et al. | | 257/627 |
| 5,540,783 A | 7/1996 | Eres et al. | | 118/725 |
| 5,601,651 A | 2/1997 | Watabe | | 118/715 |
| 5,609,689 A | 3/1997 | Kato et al. | | 118/725 |
| 5,616,181 A | 4/1997 | Yamamoto et al. | | 118/723 ER |
| 5,637,530 A | 6/1997 | Gaines et al. | | 114/105 |
| 5,641,984 A | 6/1997 | Aftergut et al. | | 257/433 |
| 5,644,128 A | 7/1997 | Wollnik et al. | | 250/251 |
| 5,667,592 A | 9/1997 | Boitnott et al. | | 118/719 |
| 5,674,786 A | 10/1997 | Turner et al. | | 437/225 |
| 5,693,139 A | 12/1997 | Nishizawa et al. | | 117/89 |
| 5,695,564 A | 12/1997 | Imahashi | | 118/719 |
| 5,705,224 A | 1/1998 | Murota et al. | | 427/248.1 |
| 5,707,880 A | 1/1998 | Aftergut et al. | | 437/3 |
| 5,711,811 A | 1/1998 | Suntola et al. | | 118/711 |
| 5,730,801 A | 3/1998 | Tepman et al. | | 118/719 |
| 5,730,802 A | 3/1998 | Ishizumi et al. | | 118/719 |
| 5,747,113 A | 5/1998 | Tsai | | 427/255.5 |
| 5,749,974 A | 5/1998 | Habuka et al. | | 118/725 |
| 5,788,447 A | 8/1998 | Yonemitsu et al. | | 414/217 |
| 5,788,799 A | 8/1998 | Steger et al. | | 156/345 |
| 5,796,116 A | 8/1998 | Nakata et al. | | 257/66 |
| 5,801,634 A | 9/1998 | Young et al. | | 340/635 |
| 5,807,792 A | 9/1998 | Ilg et al. | | 438/758 |
| 5,830,270 A | 11/1998 | McKee et al. | | 117/106 |
| 5,835,677 A | 11/1998 | Li et al. | | 392/401 |
| 5,851,849 A | 12/1998 | Comizzoli et al. | | 438/38 |
| 5,855,675 A | 1/1999 | Doering et al. | | 118/719 |
| 5,855,680 A | 1/1999 | Soininen et al. | | 118/719 |
| 5,856,219 A | 1/1999 | Naito et al. | | 438/241 |
| 5,858,102 A | 1/1999 | Tsai | | 118/719 |
| 5,866,213 A | 2/1999 | Foster et al. | | 427/573 |
| 5,866,795 A | 2/1999 | Wang et al. | | 73/1.36 |
| 5,879,459 A | 3/1999 | Gadgil et al. | | 118/715 |
| 5,882,165 A | 3/1999 | Maydan et al. | | 414/217 |
| 5,882,413 A | 3/1999 | Beaulieu et al. | | 118/719 |
| 5,904,565 A | 5/1999 | Nguyen et al. | | 438/687 |
| 5,916,365 A | 6/1999 | Sherman | | 117/92 |
| 5,923,056 A | 7/1999 | Lee et al. | | 257/192 |
| 5,923,985 A | 7/1999 | Aoki et al. | | 438/301 |
| 5,925,574 A | 7/1999 | Aoki et al. | | 437/31 |
| 5,928,389 A | 7/1999 | Jevtic | | 29/25.01 |
| 5,942,040 A | 8/1999 | Kim et al. | | 118/726 |
| 5,947,710 A | 9/1999 | Cooper et al. | | 418/63 |
| 5,972,430 A | 10/1999 | DiMeo, Jr. et al. | | 427/255.32 |
| 6,001,669 A | 12/1999 | Gaines et al. | | 438/102 |
| 6,015,590 A | 1/2000 | Suntola et al. | | 427/255.23 |
| 6,025,627 A | 2/2000 | Forbes et al. | | 257/321 |
| 6,036,773 A | 3/2000 | Wang et al. | | 117/97 |
| 6,042,652 A | 3/2000 | Hyun et al. | | 118/719 |
| 6,043,177 A | 3/2000 | Falconer et al. | | 502/4 |
| 6,045,315 A | * 4/2000 | Azumano et al. | | 414/217 |
| 6,051,286 A | 4/2000 | Zhao et al. | | 427/576 |
| 6,062,798 A | 5/2000 | Muka | | 414/416 |
| 6,071,808 A | 6/2000 | Merchant et al. | | 438/633 |
| 6,084,302 A | 7/2000 | Sandhu | | 257/751 |
| 6,086,677 A | 7/2000 | Umotoy et al. | | 118/715 |
| 6,110,556 A | 8/2000 | Bang et al. | | 428/64.1 |
| 6,113,977 A | 9/2000 | Soininen et al. | | 427/64 |
| 6,117,244 A | 9/2000 | Bang et al. | | 118/715 |
| 6,124,158 A | 9/2000 | Dautartas et al. | | 438/216 |
| 6,130,147 A | 10/2000 | Major et al. | | 438/604 |
| 6,139,700 A | 10/2000 | Kang et al. | | 204/192.17 |
| 6,140,237 A | 10/2000 | Chan et al. | | 438/687 |
| 6,140,238 A | 10/2000 | Kitch | | 438/687 |
| 6,143,659 A | 11/2000 | Leem | | 438/688 |
| 6,144,060 A | 11/2000 | Park et al. | | 257/310 |
| 6,158,446 A | 12/2000 | Mohindra et al. | | 134/25.4 |
| 6,174,377 B1 | 1/2001 | Doering et al. | | 118/729 |
| 6,174,809 B1 | 1/2001 | Kang et al. | | 438/682 |
| 6,183,563 B1 | 2/2001 | Choi et al. | | 118/715 |
| 6,200,893 B1 | 3/2001 | Sneh | | 438/685 |
| 6,203,613 B1 | 3/2001 | Gates et al. | | 117/104 |
| 6,206,967 B1 | 3/2001 | Mak et al. | | 118/666 |
| 6,207,302 B1 | 3/2001 | Sugiura et al. | | 428/690 |
| 6,231,672 B1 | 5/2001 | Choi et al. | | 118/715 |
| 6,244,811 B1 | * 6/2001 | Kroeker et al. | | 414/217 |
| 6,248,605 B1 | 6/2001 | Harkonen et al. | | 438/29 |
| 6,270,572 B1 | 8/2001 | Kim et al. | | 117/93 |
| 6,271,148 B1 | 8/2001 | Kao et al. | | 438/727 |
| 6,287,965 B1 | 9/2001 | Kang et al. | | 438/648 |
| 6,291,876 B1 | 9/2001 | Stumborg et al. | | 257/632 |
| 6,305,314 B1 | 10/2001 | Sneh et al. | | 118/723 R |
| 6,306,216 B1 | 10/2001 | Kim et al. | | 118/725 |
| 6,316,098 B1 | 11/2001 | Yitzchaik et al. | | 428/339 |
| 6,395,094 B1 | * 5/2002 | Tanaka et al. | | 118/719 |
| 6,447,607 B2 | 9/2002 | Soininen et al. | | 117/200 |
| 6,478,872 B1 | 11/2002 | Chae et al. | | 117/88 |
| 6,481,945 B1 | 11/2002 | Hasper et al. | | 414/217 |

| | | | | |
|---|---|---|---|---|
| 6,511,539 B1 | 1/2003 | Raaijmakers ............... 117/102 | JP | 01-296673 | 11/1989 | ........... H01L/29/88 |
| 6,551,406 B2 | 4/2003 | Kilpi ......................... 118/728 | JP | 01-303770 | 12/1989 | ........... H01L/39/24 |
| 2001/0000866 A1 | 5/2001 | Sneh et al. ............. 118/723 R | JP | 01-305894 | 12/1989 | ........... C30B/23/08 |
| 2001/0009140 A1 | 7/2001 | Bondestam et al. ........ 118/725 | JP | 01-313927 | 12/1989 | ......... H01L/21/205 |
| 2001/0011526 A1 | 8/2001 | Doering et al. ............ 118/729 | JP | 02-012814 | 1/1990 | ......... H01L/21/205 |
| 2001/0013312 A1 | 8/2001 | Soininen et al. ............. 117/86 | JP | 02-014513 | 1/1990 | ......... H01L/21/205 |
| 2001/0014371 A1 | 8/2001 | Kilpi ..................... 427/255.28 | JP | 02-017634 | 1/1990 | ......... H01L/21/225 |
| 2001/0031562 A1 | 10/2001 | Raaijmakers et al. ....... 438/770 | JP | 02-063115 | 3/1990 | ........... H01L/21/20 |
| 2001/0034123 A1 | 10/2001 | Jeon et al. .................. 438/643 | JP | 02-074029 | 3/1990 | ......... H01L/21/205 |
| 2001/0041250 A1 | 11/2001 | Werkhoven et al. ........ 428/212 | JP | 02-074587 | 3/1990 | ........... C30B/23/08 |
| 2001/0042523 A1 | 11/2001 | Kesala ...................... 122/6.6 | JP | 02-106822 | 4/1990 | ........... H01B/13/00 |
| 2001/0042799 A1 | 11/2001 | Kim et al. .................. 239/553 | JP | 02-129913 | 5/1990 | ......... H01L/21/205 |
| 2001/0054377 A1 | 12/2001 | Lindfors et al. ............ 117/104 | JP | 02-162717 | 6/1990 | ........... H01L/21/20 |
| 2002/0000196 A1 | 1/2002 | Park .......................... 118/715 | JP | 02-172895 | 7/1990 | ........... C30B/29/36 |
| 2002/0007790 A1 | 1/2002 | Park .......................... 118/715 | JP | 02-196092 | 8/1990 | ........... C30B/25/14 |
| 2002/0041931 A1 | 4/2002 | Suntola et al. ......... 427/255.28 | JP | 02-203517 | 8/1990 | ......... H01L/21/205 |
| 2002/0052097 A1 | 5/2002 | Park .......................... 438/507 | JP | 02-230690 | 9/1990 | ........... H05B/33/10 |
| 2002/0086106 A1 | 7/2002 | Park et al. ............... 427/248.1 | JP | 02-230722 | 9/1990 | ......... H01L/21/205 |
| 2002/0092471 A1 | 7/2002 | Kang et al. ................ 118/715 | JP | 02-246161 | 10/1990 | ......... H01L/29/784 |
| 2002/0094689 A1 | 7/2002 | Park .......................... 438/694 | JP | 02-264491 | 10/1990 | ............. H01S/3/18 |
| 2002/0108570 A1 | 8/2002 | Lindfors .................... 118/715 | JP | 02-283084 | 11/1990 | ............. H01S/3/18 |
| 2002/0134307 A1 | 9/2002 | Choi .......................... 118/715 | JP | 02-304916 | 12/1990 | ......... H01L/21/205 |
| 2003/0004723 A1 | 1/2003 | Chihara ..................... 704/260 | JP | 03-019211 | 1/1991 | ......... H01L/21/205 |
| 2003/0075273 A1 | 4/2003 | Kilpela et al. ......... 156/345.33 | JP | 03-022569 | 1/1991 | ......... H01L/29/804 |
| 2003/0075925 A1 | 4/2003 | Lindfors et al. ............ 285/367 | JP | 03-023294 | 1/1991 | ........... C30B/25/18 |
| 2003/0123958 A1 * | 7/2003 | Sieradzki et al. ........... 414/217 | JP | 03-023299 | 1/1991 | ........... C30B/29/40 |
| | | | JP | 03-044967 | 2/1991 | ........... H01L/29/48 |
| FOREIGN PATENT DOCUMENTS | | | JP | 03-048421 | 3/1991 | ......... H01L/21/302 |
| EP | 0 799 641 A2 | 10/1997 | ........... B01J/20/32 | JP | 03-070124 | 3/1991 | ......... H01L/21/205 |
| EP | 1167569 | 1/2002 | ......... C23C/16/455 | JP | 03-185716 | 8/1991 | ......... H01L/21/205 |
| FR | 2692597 | 12/1993 | ........... C23C/16/00 | JP | 03-208885 | 9/1991 | ........... C30B/23/02 |
| GB | 2 355 727 A | 5/2001 | ........... C23C/16/44 | JP | 03-234025 | 10/1991 | ......... H01L/21/318 |
| JP | 58-098917 | 6/1983 | ......... H01L/21/205 | JP | 03-286522 | 12/1991 | ......... H01L/21/205 |
| JP | 58-100419 | 6/1983 | ........... H01L/21/20 | JP | 03-286531 | 12/1991 | ......... H01L/21/316 |
| JP | 60-065712 A | 4/1985 | ......... C01B/33/113 | JP | 04031391 | 2/1992 | ........... C30B/23/08 |
| JP | 61-035847 | 2/1986 | ........... B01J/19/08 | JP | 04-031396 | 2/1992 | ........... C30B/25/14 |
| JP | 61-210623 | 9/1986 | ......... H01L/21/205 | JP | 04-100292 | 4/1992 | ............. H01S/3/18 |
| JP | 62-069508 | 3/1987 | ......... H01L/21/203 | JP | 04-111418 | 4/1992 | ......... H01L/21/205 |
| JP | 62-091495 | 4/1987 | ........... C30B/25/02 | JP | 04-132214 | 5/1992 | ......... H01L/21/205 |
| JP | 62-141717 | 6/1987 | ......... H01L/21/203 | JP | 04-132681 | 5/1992 | ........... C30B/25/14 |
| JP | 62-167297 | 7/1987 | ........... C30B/29/40 | JP | 04/151822 | 5/1992 | ......... H01L/21/205 |
| JP | 62-171999 | 7/1987 | ........... C30B/29/40 | JP | 04-162418 | 6/1992 | ......... H01L/21/205 |
| JP | 62-232919 | 10/1987 | ......... H01L/21/205 | JP | 04-175299 | 6/1992 | ........... C30B/29/68 |
| JP | 63-062313 | 3/1988 | ......... H01L/21/203 | JP | 04-186824 | 7/1992 | ......... H01L/21/205 |
| JP | 63-085098 | 4/1988 | ........... C30B/21/40 | JP | 04-212411 | 8/1992 | ......... H01L/21/203 |
| JP | 63-090833 | 4/1988 | ......... H01L/21/365 | JP | 04-260696 | 9/1992 | ........... C30B/29/40 |
| JP | 63-222420 | 9/1988 | ......... H01L/21/205 | JP | 04-273120 | 9/1992 | ........... H01L/21/20 |
| JP | 63-222421 | 9/1988 | ......... H01L/21/205 | JP | 04-285167 | 10/1992 | ........... C23C/14/54 |
| JP | 63-227007 | 9/1988 | ......... H01L/21/205 | JP | 04-291916 | 10/1992 | ......... H01L/21/205 |
| JP | 63-252420 | 10/1988 | ......... H01L/21/205 | JP | 04-325500 | 11/1992 | ........... C30B/33/00 |
| JP | 63-266814 | 11/1988 | ......... H01L/21/205 | JP | 04-328874 | 11/1992 | ......... H01L/29/804 |
| JP | 64-009895 | 1/1989 | ........... C30B/29/40 | JP | 05-029228 | 2/1993 | ......... H01L/21/205 |
| JP | 64-009896 | 1/1989 | ........... C30B/29/40 | JP | 05-047665 | 2/1993 | ......... H01L/21/205 |
| JP | 64-009897 | 1/1989 | ........... C30B/29/40 | JP | 05-047666 | 2/1993 | ......... H01L/21/205 |
| JP | 64-037832 | 2/1989 | ......... H01L/21/205 | JP | 05-047668 | 2/1993 | ......... H01L/21/205 |
| JP | 64-082615 | 3/1989 | ......... H01L/21/205 | JP | 5-74739 | * 3/1993 | |
| JP | 64-082617 | 3/1989 | ......... H01L/21/205 | JP | 05-074717 | 3/1993 | ......... H01L/21/205 |
| JP | 64-082671 | 3/1989 | ........... H01L/29/78 | JP | 05-074724 | 3/1993 | ......... H01L/21/205 |
| JP | 64-082676 | 3/1989 | ........... H01L/29/80 | JP | 05-102189 | 4/1993 | ......... H01L/21/336 |
| JP | 01-103982 | 4/1989 | ........... C30B/23/08 | JP | 05-160152 | 6/1993 | ......... H01L/21/336 |
| JP | 01-103996 | 4/1989 | ........... C30B/29/40 | JP | 05-175143 | 7/1993 | ......... H01L/21/205 |
| JP | 64-090524 | 4/1989 | ........... H01L/21/20 | JP | 05-175145 | 7/1993 | ......... H01L/21/205 |
| JP | 01-117017 | 5/1989 | ......... H01L/21/203 | JP | 05-182906 | 7/1993 | ........... H01L/21/20 |
| JP | 01-143221 | 6/1989 | ......... H01L/21/314 | JP | 05-186295 | 7/1993 | ........... C30B/25/02 |
| JP | 01-143233 | 6/1989 | ........... H01L/21/76 | JP | 05-206036 | 8/1993 | ......... H01L/21/205 |
| JP | 01-236657 | 9/1989 | ........... H01L/29/80 | JP | 05-234899 | 9/1993 | ......... H01L/21/205 |
| JP | 01-245512 | 9/1989 | ......... H01L/21/205 | JP | 05-235047 | 9/1993 | ......... H01L/21/338 |
| JP | 01-264218 | 10/1989 | ......... H01L/21/205 | JP | 05-251339 | 9/1993 | ........... H01L/21/20 |
| JP | 01-272108 | 10/1989 | ......... H01L/21/203 | JP | 05-270997 | 10/1993 | ........... C30B/29/68 |
| JP | 01-290221 | 11/1989 | ......... H01L/21/205 | JP | 05-283336 | 10/1993 | ........... H01L/21/20 |
| JP | 01-290222 | 11/1989 | ......... H01L/21/205 | JP | 05-291152 | 11/1993 | ......... H01L/21/205 |

| | | | |
|---|---|---|---|
| JP | 05-304334 | 11/1993 | ............. H01L/3/18 |
| JP | 05-343327 | 12/1993 | ......... H01L/21/205 |
| JP | 05-343685 | 12/1993 | ......... H01L/29/784 |
| JP | 06-045606 | 2/1994 | ......... H01L/29/784 |
| JP | 06-132236 | 5/1994 | ......... H01L/21/205 |
| JP | 06-177381 | 6/1994 | ......... H01L/29/784 |
| JP | 06-196809 | 7/1994 | ............. H01S/3/18 |
| JP | 06-222388 | 8/1994 | ........... G02F/1/136 |
| JP | 06-224138 | 8/1994 | ......... H01L/21/205 |
| JP | 06-230421 | 8/1994 | ........... G02F/1/136 |
| JP | 06-252057 | 9/1994 | ......... H01L/21/205 |
| JP | 06-291048 | 10/1994 | ......... H01L/21/205 |
| JP | 07-070752 | 3/1995 | ........... C23C/16/40 |
| JP | 07-086269 | 3/1995 | ......... H01L/21/314 |
| JP | 08-181076 | 7/1996 | ......... H01L/21/205 |
| JP | 08-245291 | 9/1996 | ........... C30B/25/14 |
| JP | 08-264530 | 10/1996 | ....... H01L/21/3205 |
| JP | 09-260786 | 10/1997 | ............. H01S/3/18 |
| JP | 09-293681 | 11/1997 | ......... H01L/21/205 |
| JP | 10-188840 | 7/1998 | ............ H01J/29/18 |
| JP | 10-190128 | 7/1998 | ............. H01S/3/18 |
| JP | 10-308283 | 11/1998 | ........... H05B/33/22 |
| JP | 01-154511 | 6/1999 | ........... H01L/21/20 |
| JP | 01-270593 | 10/1999 | ........... C30B/25/02 |
| JP | 11-269652 | 10/1999 | ........... C23C/16/44 |
| JP | 2000-031387 | 1/2000 | ........... H01L/27/04 |
| JP | 2000-058777 | 2/2000 | ......... H01L/27/108 |
| JP | 2000-068072 | 3/2000 | ........... H05B/33/22 |
| JP | 2000-087029 | 3/2000 | ........... C09K/11/08 |
| JP | 2000-319772 | 3/2000 | ........... C23C/16/00 |
| JP | 2000-138094 | 5/2000 | ........... H05B/33/10 |
| JP | 2000-218445 | 8/2000 | ............. B23P/6/00 |
| JP | 2000-319772 | 11/2000 | ........... C23C/14/24 |
| JP | 2000-340883 | 12/2000 | ........... H01S/5/125 |
| JP | 2000-353666 | 12/2000 | ......... H01L/21/205 |
| JP | 2001-020075 | 1/2001 | ........... C23C/16/44 |
| JP | 2001-62244 | 3/2001 | ........... B01D/53/34 |
| JP | 2001-152339 | 6/2001 | ........... C23C/16/40 |
| JP | 2001-172767 | 6/2001 | ........... C23C/16/40 |
| JP | 2001-189312 | 7/2001 | ......... H01L/21/316 |
| JP | 2001-217206 | 8/2001 | ......... H01L/21/285 |
| JP | 2001-220287 | 8/2001 | ........... C30B/25/02 |
| JP | 2001-220294 | 8/2001 | ........... C30B/29/20 |
| JP | 2001-240972 | 9/2001 | ......... C23C/16/458 |
| JP | 2001-254181 | 9/2001 | ........... C23C/16/46 |
| JP | 2001-284042 | 10/2001 | ........... H05B/33/04 |
| JP | 2001-303251 | 10/2001 | ........... C23C/16/44 |
| JP | 2001-328900 | 11/2001 | ........... C30B/29/68 |
| WO | 90/02216 | 3/1990 | ........... C23C/14/34 |
| WO | 91/10510 | 7/1991 | ............. B01J/37/02 |
| WO | 93/02110 | 2/1993 | ............. C08F/4/78 |
| WO | 96/17107 | 6/1996 | ........... C23C/16/44 |
| WO | 96/18756 | 6/1996 | ........... C23C/16/08 |
| WO | 98/06889 | 2/1998 | |
| WO | 99/01595 | 1/1999 | ........... C30B/25/14 |
| WO | WO9913504 | 3/1999 | ........... H01L/21/68 |
| WO | 99/29924 | 6/1999 | ........... C23C/16/04 |
| WO | 99/41423 | 8/1999 | |
| WO | 99/65064 | 12/1999 | ........... H01L/21/00 |
| WO | 00/11721 | 3/2000 | ........... H01L/29/43 |
| WO | 00/15865 | 3/2000 | ........... C23C/16/00 |
| WO | 00/15881 A2 | 3/2000 | |
| WO | 00/16377 A2 | 3/2000 | |
| WO | 00/54320 A1 | 9/2000 | ........... H01L/21/44 |
| WO | 00/63957 A1 | 10/2000 | ......... H01L/21/205 |
| WO | 00/79019 A1 | 12/2000 | ........... C23C/16/00 |
| WO | 00/79576 | 12/2000 | ......... H01L/21/205 |
| WO | 00/79576 A1 | 12/2000 | ......... H01L/21/205 |
| WO | 01/15220 A1 | 3/2001 | ......... H01L/21/768 |
| WO | 01/15220 | 3/2001 | ......... H01L/21/768 |
| WO | 01/17692 | 3/2001 | ........... B05C/11/00 |
| WO | 01/27346 A1 | 4/2001 | ........... C23C/16/44 |
| WO | 01/29280 A1 | 4/2001 | ........... H01L/21/00 |
| WO | 01/29891 A1 | 4/2001 | ......... H01L/21/768 |
| WO | 01/29893 A1 | 4/2001 | ......... H01L/21/768 |
| WO | 01/36702 | 5/2001 | ........... C23C/16/00 |
| WO | 01/36702 A1 | 5/2001 | ........... C23C/16/00 |
| WO | 01/40541 A1 | 6/2001 | ........... C23C/16/40 |
| WO | 01/66832 A2 | 9/2001 | ........... C23C/16/44 |
| WO | 02/08488 | 1/2002 | ........... C23C/16/44 |

OTHER PUBLICATIONS

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C–hydraazine–reduced TiN film with low resistivity", IEDM 92–979, pp. 11.8.1–11.8.3.

Suzuki, et al., "LPCVK–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal compleses", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Choi, et al., "The effect of annealing on resistivity of low pressure chemical vapor depositied titanium deboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

Kitigawa, et al., "Hydrogen–mediated low temperature epitaxy of Si in plasma–enhanced chemical vapor deposition", Applied Surface Science (2000), pp. 30–34.

"Cluster tools for fabrication of Advanced Devices", Japanese Journal of Applied Physics, Extended abstracts 22nd Conf. Solid State Devices and Materials (1990), pp. 849–852, XP000178141.

"Integrated Processing Equipment"Solid State Tecnology, US, Cowan Publishing Corp. Washington, vol. 33, No. 5, May 1, 1990, pp. 149–154, XP000128331.

"Applications of Integrated Processing " Solid State Technology, US, Cowan Publishing Corp. Washington, vol. 37, No. 12, Dec. 1, 1994, pp. 45–47, 49, XP000485593.

Hultman, et al., "Review of the thermal and mechanical stability of TiN–based thin films", *Zeitschrift Fur Metallkunde*, 90(10) (Oct. 1999), pp. 803–813.

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460–467.

Wise, et al., "Diethyldiethoxysilane as a new precursor for $SiO_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions", *Appl. Surf. Sci.*, vol. 162–163 (Jul. 1999), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Maertensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*,142(8) (Aug. 1995), pp. 2731–2737.

Elers, et al., "NbC15 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as precursors", *Chemical Vapor Deposition*, 5(2) (Mar. 1999), pp. 69–73.

Martensson, et al., "Atomic Layer Epitaxy of Copper, Growth & Selectivity in the Cu (11)–2,2.6, 6–Tetramethyl–3, 5–Heptanedion ATE/H2 Process", *J. Electrochem. Soc.*, 145(8) (Aug. 1998), pp. 2926–2931.

Min, et al., "Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Techol.* 12(1) (Jan/Feb 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

\* cited by examiner

DUAL ROBOT PROCESSING SYSTEM

BACKGROUND OF THE DISCLOSURE

1. Field of Invention

Embodiments of the invention generally relate to a semiconductor processing system.

2. Background of Invention

Semiconductor substrate processing is typically performed by subjecting a substrate to a plurality of sequential processes to create devices, conductors and insulators on the substrate. These processes are generally performed in a processing chamber configured to perform a single step of the fabrication process. In order to efficiently complete the entire sequence of processing steps, a number of processing chambers are typically coupled to a central transfer chamber that houses a robot to facilitate transfer of the substrate between the surrounding processing chambers. A semiconductor processing system having this configuration is generally known as a cluster tool, examples of which are the families of PRODUCER™, CENTURA® and ENDURA® processing systems available from Applied Materials, Inc., located in Santa Clara, Calif.

Generally, a cluster tool consists of a central transfer chamber having one or more robots disposed therein. The transfer chamber is generally surrounded by one of more processing chambers and at least one load lock chamber to facilitate transfer of substrates into and out of the tool. The processing chambers are generally utilized to process the substrate, for example, performing various processing steps such as etching, physical vapor deposition, chemical vapor deposition, ion implantation, lithography and the like. Processes are typically performed in the processing chambers at vacuum pressures. The transfer chamber is maintained at vacuum pressure to avoid having to repeatedly pump down the processing chamber after each substrate transfer.

Although conventional cluster tools are generally desirable for large scale device fabrication, these systems have floor space requirements that make them impractical for smaller scale production lines. For example, a cluster tool configured to provide single layer deposition utilizing a compact mainframe is generally not available. Such systems generally require only one or two processing chambers coupled to a transfer chamber. As transfer chambers known to the inventors are generally configured to accommodate more than two processing chambers, the utilization of only two chambers on such a transfer chamber, while leaving the remaining space for other processing chambers vacant, results in high tool costs and unnecessary consumption of floor space generally without providing maximized substrate processing throughput.

Therefore, there is a need for substrate processing system that provides high throughput and process flexibility in a compact design.

SUMMARY OF INVENTION

A substrate processing system having a transfer chamber having two processing chambers and two load lock chambers coupled thereto is generally provided. Two transfer robots are disposed in the transfer chamber and provide parallel or sequential processing of substrates between the processing chambers as desired.

In one embodiment, a substrate processing system includes two load lock chambers and two processing chambers coupled to a transfer chamber. The transfer chamber includes a body having a first transfer area and a second transfer area, one on either side of a center axis of the transfer chamber. A first passage couples one of the load locks with the first transfer area and a second passage couples the other load lock with the second transfer area. The first passage and the second passage form an acute angle with the center axis. A transfer platform is disposed between the first transfer area and the second transfer area. A first transfer robot and a second transfer robot are disposed in the first and second transfer areas, respectively. Each robot is adapted to transfer substrates between the load locks, the transfer platform and respective processing chambers.

In another embodiment, a substrate processing system includes a transfer chamber having two load lock chambers and two processing chambers coupled thereto. The transfer chamber includes a body having a first transfer area and a second transfer area defined therein on either side of a center axis. A first passage couples one of the load locks with the first transfer area and a second passage couples the other one of the load locks with the second transfer area. A transfer platform is disposed between the first transfer area and the second transfer area. The transfer platform is configured to orient a substrate seated thereon and may additionally include a lift mechanism for placing the substrate and transfer platform in a spaced-apart relationship to facilitate substrate transfer. A first transfer robot and a second transfer robot are disposed in the first and second transfer areas, respectively. Each robot is adapted to transfer substrates between the load locks, the transfer platform and respective processing chambers.

BRIEF DESCRIPTION OF DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF INVENTION

Figure 1:
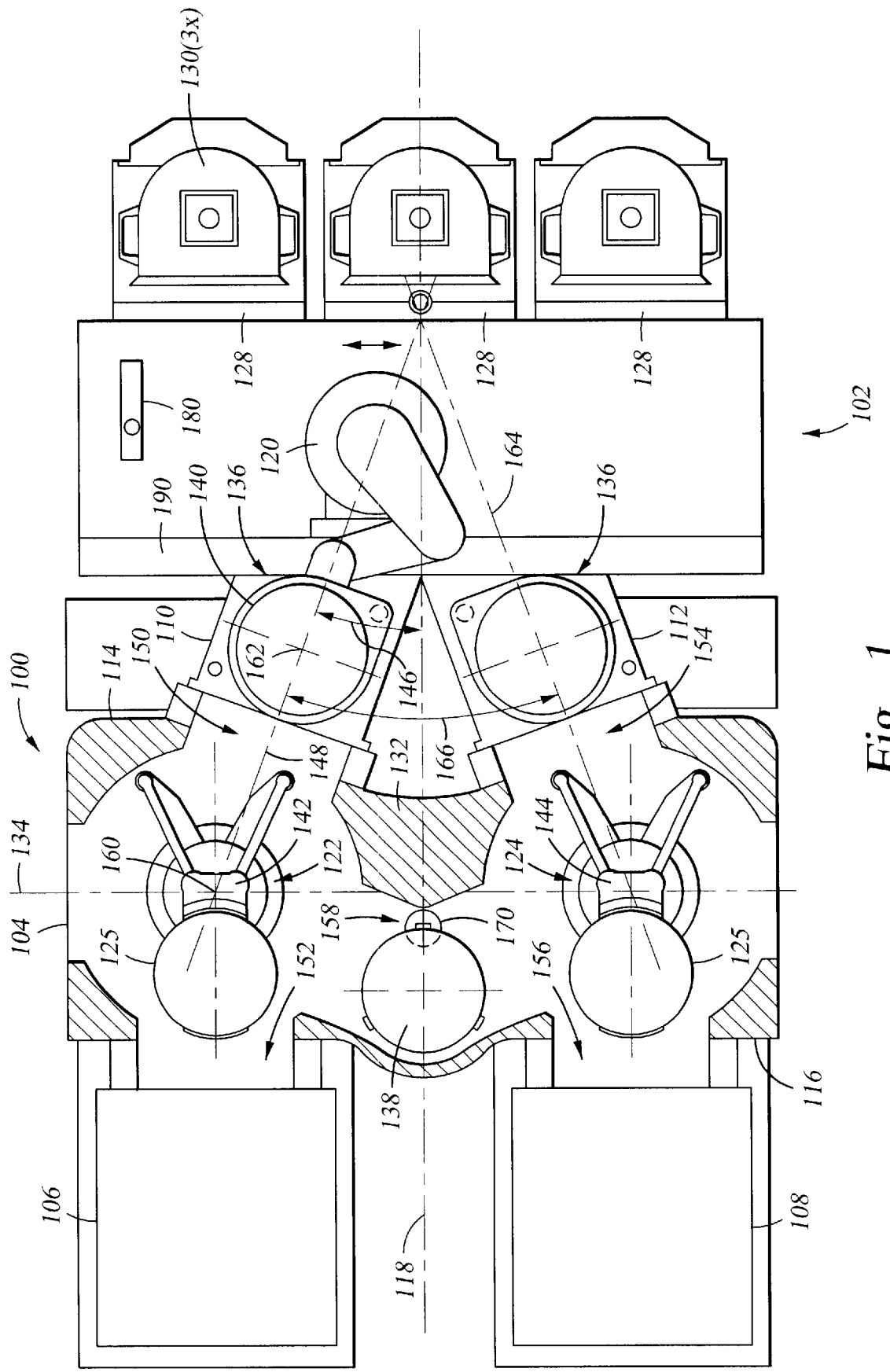
FIG. 1 is a plan view of one embodiment of a substrate processing system of the present invention.

FIG. 1 depicts one embodiment of a substrate processing system 100 that generally includes a factory interface 102, a first load lock chamber 110, a second load lock chamber 112, a first processing chamber 106, a second processing chamber 108 and a transfer chamber 104. The processing chambers 106, 108 are coupled to the transfer chamber 104. The load lock chambers 110, 112 are coupled between the transfer chamber 104 and the factory interface 102. Substrates 125 are generally transferred from the factory interface 102 through one of the load locks 110, 112 and transfer chamber 104 to one of the processing chambers 106, 108 for processing.

The factory interface 102 generally includes an interface robot 120, an aligner 180 and a plurality of bays 128 (three are shown). Each bay 128 is adapted to receive a substrate storage cassette 130 that holds a plurality of substrates 125. The factory interface 102 is coupled to the load lock chambers 110, 112 through ports 136 that are positioned opposite bays 128.

The interface robot 120 is generally positioned between the ports 136 and bays 128 to facilitate transfer of substrates between the cassettes 130, the aligner 180 and the load lock chambers 110, 112. The factory interface robot 120 may be fixed within the factory interface 102 and configured to have a range of motion that permits substrate transfer between the cassettes 130, the aligner 180 and the load lock chambers 110, 112. In the embodiment depicted in FIG. 1, the interface robot 120 is movably disposed on a rail 190 disposed in the factory interface 102 parallel to the bays 128. The interface robot 120 is moved along the rail 190 by an actuator (not shown) that allows the interface robot 120 to be positioned adjacent each bay 128 that decreases the range of motion required by the robot 120 to facilitate substrate transfer. Thus, a more compact robot design may be utilized (i.e., shorter linkages and smaller drives), which accordingly reduces the footprint of the system 100. The interface robot 120 generally includes a blade 140 having a gripper used to secure the substrate 125 thereto during transfer. The gripper utilizes a vacuum or a plurality of fingers that grip the substrate's edge to retain the substrate to the blade 140. An example of one factory interface that may be used to advantage is described in U.S. patent application Ser. No. 09/161,970, filed Sep. 28, 1998 by Kroeker, which is hereby incorporated by reference in its entirety.

Figure 2:
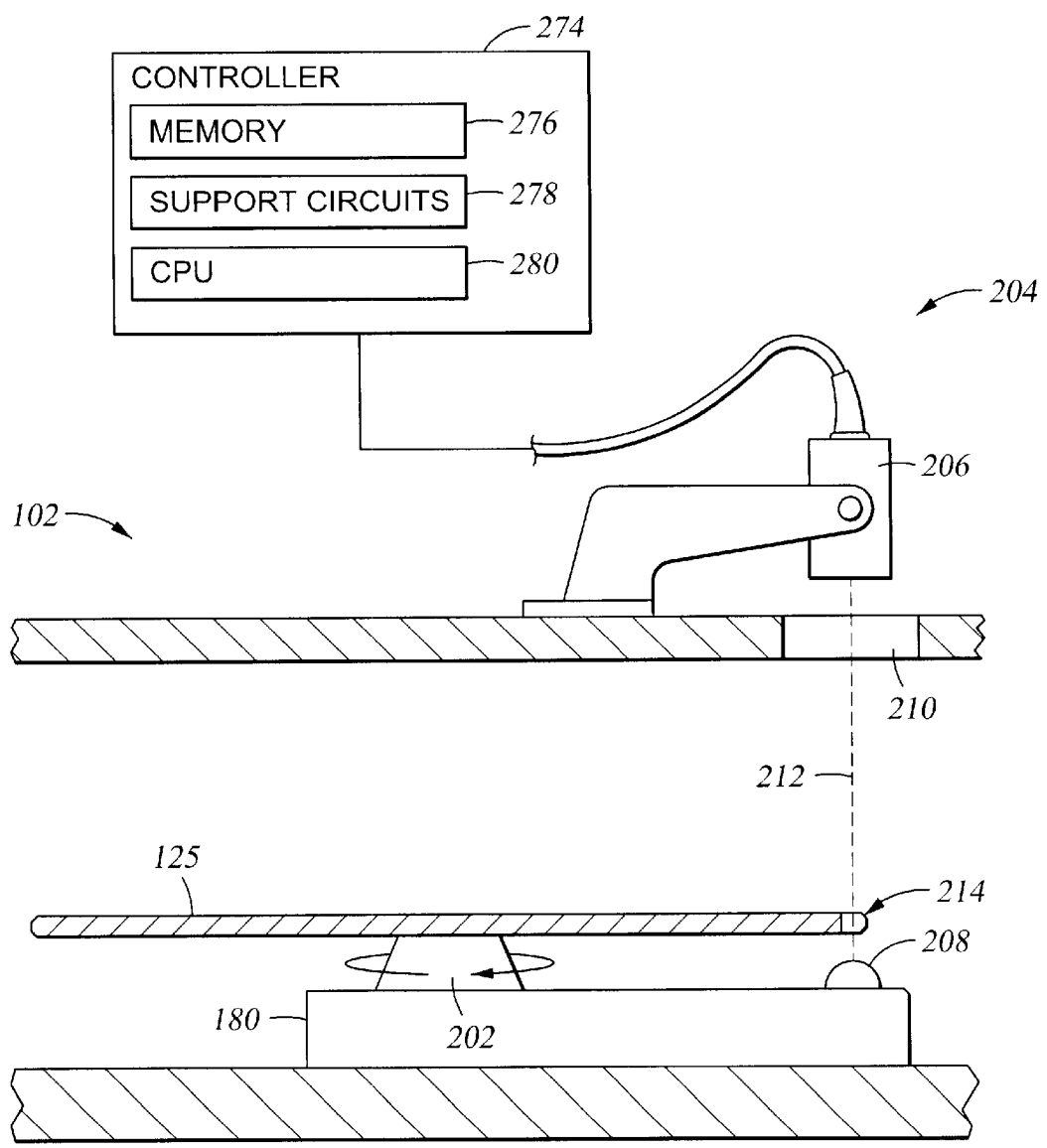
FIG. 2 illustrates one embodiment of an aligner disposed in the substrate processing system of FIG. 2.

FIG. 2 depicts one embodiment of the aligner 180. The aligner 180 generally includes a turntable 202 for rotating the substrate 125 and a detection system 204 for detecting an indicia 214 of substrate orientation such as a notch or flat in the perimeter of the substrate. The interface robot 120 places the substrate 125 on the turntable 202. The turntable 202 is adapted to controllably rotate the substrate 125 and may include a retention means such as a vacuum chuck (not shown). In one embodiment, the detection system 204 includes an emitter 206 and a receiver 208. The emitter 206 is typically positioned on the exterior of the factory interface 102. The emitter 206 views the substrate through a window 210 disposed in the factory interface 102. The window 210 is comprised of a material substantially transparent to a beam 212 generated by the emitter 206. The beam 212, such as a light wave, passes through the window 210 and is sensed by the receiver 208 positioned in the interior of the factory interface 102.

The receiver 208 typically communicates with a controller 274 that is coupled to the turntable 202. The controller 274 generally includes memory 276, support circuits 278 and a central processing unit (CPU) 280. When information regarding the orientation of the substrate 125 is desired, the controller 274 is prompted to retrieve a routine from the memory 276. The CPU 280 executes the routine and instructs the turntable 202 to rotate the substrate 125. While the substrate 125 is rotating, the beam 212 generated by the emitter 206 impinges on the receiver 208 when the indicia 214 is inline with the emitter 206 and receiver 208, which is generally indicative of the angular position of the indicia 214 and substrate. Utilizing the information provided by the receiver 208, the controller 274 may selectively rotate the turntable 202 to place the substrate 125 in a pre-determined rotational orientation.

Figure 3A:
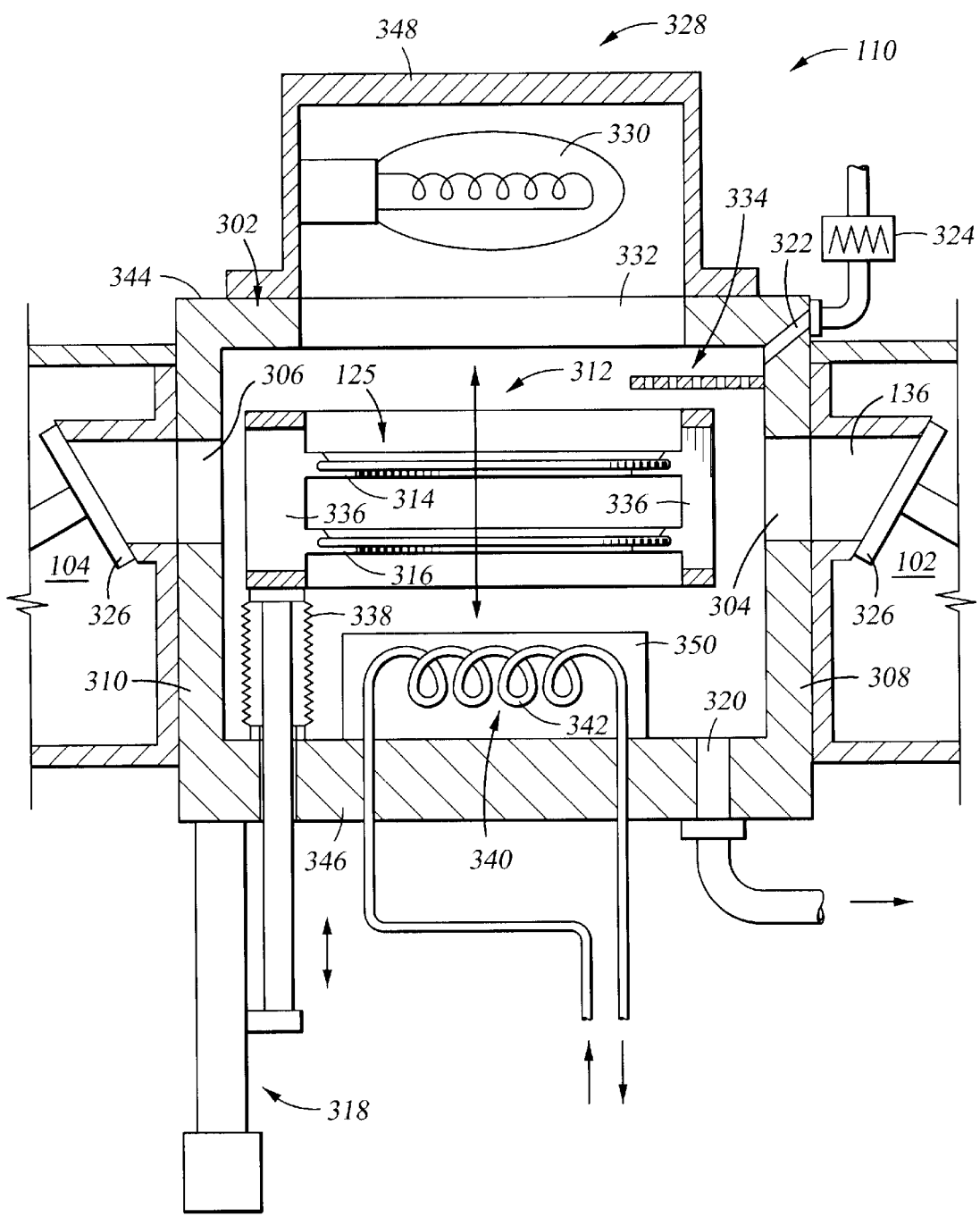
FIG. 3A is a sectional view of one embodiment of a load lock chamber.

FIG. 3A depicts one embodiment of the first load lock chamber 110. The second load lock chamber 112 may be similarly configured. The first load lock chamber 110 is generally used to facilitate transfer of the substrates 125 between the vacuum environment of the transfer chamber 104 and the environment of the factory interface 102 that is typically at or near atmospheric pressure. The first load lock chamber 110 includes a body 302 having top 344, bottom 346 and sidewalls 308, 310. A first port 304 and a second port 306 typically disposed through opposing sidewalls 308 and 310. A substrate support hoop 312 is movably disposed within the body 302. The hoop 312 has two sets of vertically stacked, substrate receiving flanges 314, 316, each configured to retain one substrate. The first set of flanges 314 is typically utilized to pass substrates to the transfer chamber 104. The second set of flanges 316 is disposed below the first flange set 314 and is typically utilized to pass substrates to the factory interface 102. Two access slots 336 are disposed through the hoop 312 and align with the ports 304, 306 to placement and retrieval of the substrate from the flange sets 314, 316. The hoop 312 is coupled to a lift mechanism 318 that selectively positions each flange 314, 316 vertically within the body 302 adjacent the ports 304, 306 to allow substrate transfer through the ports 304, 306. A bellows 338 is sealingly coupled between the lift mechanism 318 and the chamber bottom 346 to prevent gas leak therebetween.

The body 302 generally includes a pumping port 320 typically disposed on the lower portion of the body 302. The pumping port 320 is coupled to a pumping system (not shown) to evacuate the first load lock chamber 110 to a vacuum level substantially equal to the transfer chamber 104. A vent 322 is typically disposed in the upper portion of the body 302 and is selectively opened to allow the pressure within the first load lock chamber 110 to rise to substantially equal the pressure within the factory interface 102. The vent 322 is typically in communication with a particulate air filter 324 to prevent particulate contamination of the substrates within the load lock 110 while venting. A diffuser 334 is coupled to the wall 308 to distribute the flow from the vent 322 uniformly across the substrates.

The first load lock chamber 110 may optionally include a heater module 328 and/or a heat exchanger 340. The heater module 328 is typically coupled to the top 344 of the chamber body 304 and pre-heats the substrate before entry into the transfer chamber 104. In one embodiment, the heater module 328 includes a housing 348 having a radiant heat source 330 disposed therein. The housing 348 typically at least partially covers a window 332 disposed in the top 344 of the body 304 thereby allowing the radiant heat source 330 to heat the substrate disposed in the first set of flanges 314. Typically, the hoop 312 is elevated to place the substrate in close proximity to the lamp 330 to maximize the rate of heat transfer to the substrate. Alternatively, the window 332 may be utilized as a view port in embodiments not utilizing a heater module 328.

The optional heat exchanger 340 is generally disposed on the bottom 346 of the chamber body 302. The heat exchanger 340 may be utilized to heat or cool the substrates within the first load lock chamber 110. In the embodiment depicted in FIG. 3A, the heat exchanger 340 includes a coil 342 that flows a heat transfer fluid through a plate 350 disposed on the chamber bottom 346. The coil 342 is typically coupled to a fluid source (not shown) that regulates the temperature of the heat transfer fluid. In one aspect, the heat exchanger 340 may be utilized to cool substrates disposed in the hoop 312 returning from the transfer chamber 104. Typically, the hoop 312 is lowered to place the substrate in close proximity to the plate 350 to maximize the rate of heat transfer from the substrate.

The first load lock chamber 110 is selectively isolated from the factory interface 102 and transfer chamber 104 by slit valves 326. Generally, at least one of the slit valves 326 is maintained in a closed position to prevent loss of vacuum in the transfer chamber 104. For example, the slit valve 326 disposed adjacent the first port 304 may be opened while the slit valve 326 disposed adjacent the second port 306 is closed to allow the interface robot 120 to transfer a substrate through the port 136 between the first load lock chamber 110 and the substrate storage cassettes 130 disposed in the factory interface 102. After the substrate 125 is loaded in the first flange set 314 of the hoop 312 from the interface robot 120, both slit valves 326 are closed and the first load lock chamber 110 evacuated through the pumping port 320 to a vacuum level substantially equal to that of the transfer chamber 104. Access between the evacuated load lock chamber 110 and the transfer chamber 104 is facilitated by opening the slit valve 326 adjacent the second port 306 while the slit valve 326 adjacent the first port 304 remains closed. A processed substrate is placed in the second flange set 316 and the hoop 312 is lowered and the substrate residing in the first flange set 314 is transferred into the transfer chamber 104. The processed substrate in the second flange set 316 is returned to the factory interface 102 in the reverse manner, wherein first load lock chamber 110 is vented to substantially equalize the pressure between the load lock chamber 102 and the factory interface 102. One load lock chamber that may be used to advantage is described in U.S. patent application Ser. No. 09/609,897, filed Jul. 16, 2001 by Kraus et al., and is hereby incorporated by reference in its entirety.

Figure 3B:
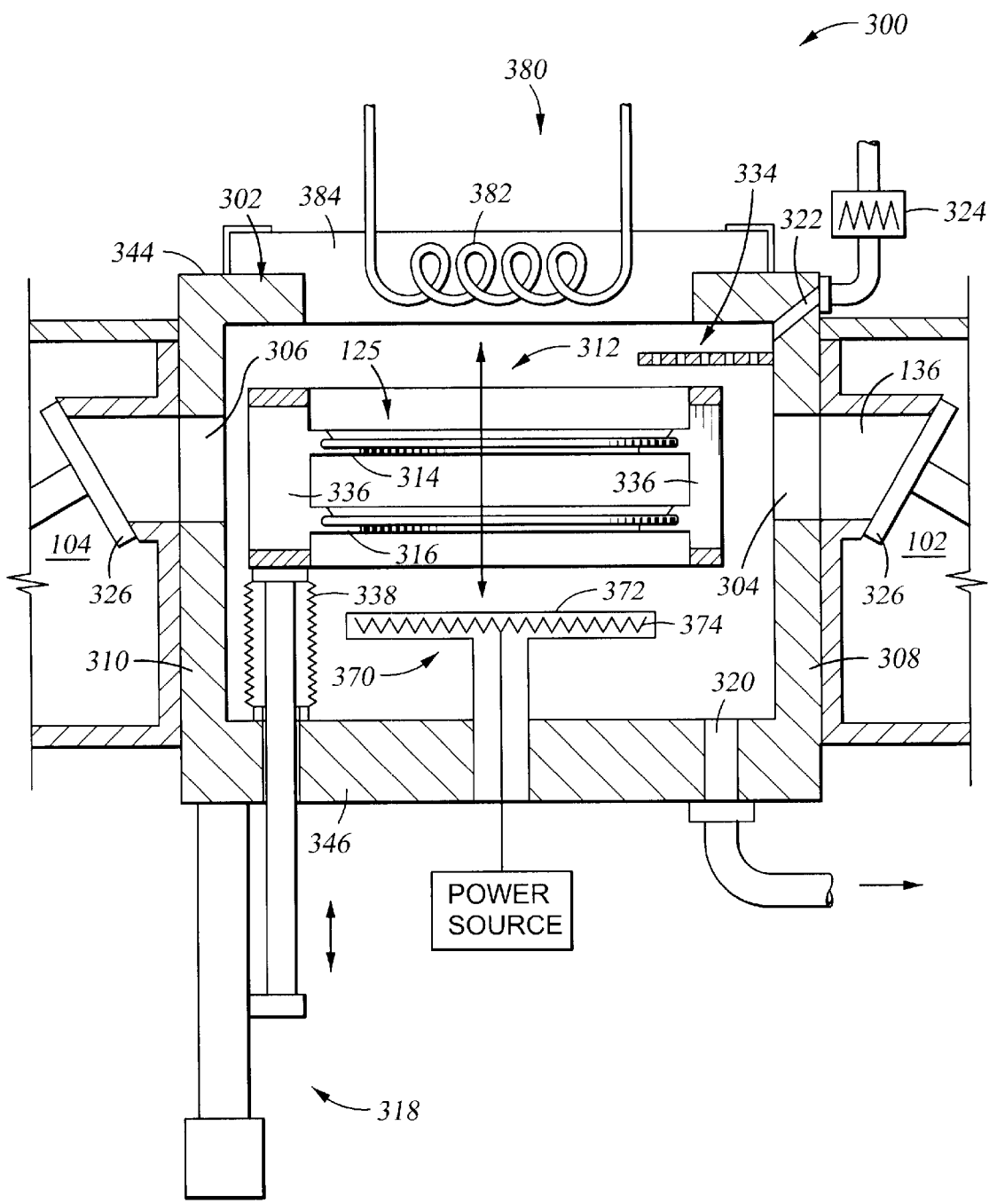
FIG. 3B is a sectional view of another embodiment of a load lock chamber.

FIG. 3B depicts another embodiment of a first load lock chamber 300. Generally, the first load lock chamber 300 is configured similarly to the first load lock chamber 110 except that the first load lock chamber 300 includes a heat exchanger 380 disposed near the top 344 of the chamber body 302 and a heater module 370 coupled to the bottom 346 of the chamber body 302.

The heat exchanger 380 is generally utilized to heat or cool the substrates within the first load lock chamber 110. In the embodiment depicted in FIG. 3B, the heat exchanger 380 includes a coil 382 that flows a heat transfer fluid through a plate 384 coupled or disposed through the chamber top 344. The coil 382 is typically coupled to a fluid source (not shown) that regulates the temperature of the heat transfer fluid. In one aspect, the heat exchanger 380 may be utilized to cool substrates disposed in the hoop 312 returning from the transfer chamber 104, particularly when it is desired to return process substrates in the upper first flange set 314. Typically, the hoop 312 is elevated to place the substrate in close proximity to the plate 384 to maximize the rate of heat transfer from the substrate.

The heater module 370 is typically coupled to the bottom 346 of the chamber body 304 and is utilized to pre-heat substrate before entry into the transfer chamber 104. In one embodiment, the heater module 328 includes a substrate support pedestal 372 having a heat source 374 coupled thereto or disposed therein. The heat source 374 may comprise a conduit for flowing a heat transfer fluid, a resistive heating element or a thermoelectric device. Typically, the hoop 312 is lowered to place the substrate in close proximity or in contact with the support pedestal 372 to maximize the rate of heat transfer to the substrate.

Returning to FIG. 1, the transfer chamber 104 is generally fabricated from a single piece of material such as aluminum. The transfer chamber 104 generally includes a first side 114 having the load locks 110, 112 coupled thereto and a second side 116 disposed opposite the first side 114. The transfer chamber 104 generally includes a first transfer area 122 and a second transfer area 124 separated by an interior wall 132 extending between the first side 114 and the second side 116. The transfer areas 122, 124 are generally aligned in the transfer chamber 104 along a line 134 parallel to the second side 116 and perpendicular to a central axis 118 of the transfer chamber 104 and system 100. Typically, the transfer chamber 118 is symmetrical about the center axis 118.

A first transfer robot 142 is disposed in the first transfer area 122 and a second transfer robot 144 is disposed in the second transfer area 124. The first transfer area 122 is coupled to the first load lock chamber 100 via first passage 150 and to the first processing chamber 106 by a second passage 152. The second transfer area 124 is coupled to the second load lock chamber 112 via third passage 154 and to the second processing chamber 108 by a fourth passage 156. The first and second transfer areas 122, 124 are coupled to each other by a pass through 158 disposed in the interior wall 132 that allows substrates to be transferred between the first and second robots 142, 144.

The first passage 150 is orientated along a line 148, defined between a center 160 of the first transfer robot 142 and the center 162 of the first load lock chamber 110, along which the substrate moves during transfer between the load lock chamber 110 and transfer chamber 104. The line 148 is disposed at an acute angle 146 with the centerline 118. A line 164 similarly defines the third passage 154 and, together with the line 148, forms an acute angle 166 about the centerline 118 of the transfer chamber 104. The acute angles of the first and third passages 150, 154 and the orientation of the load locks 110, 112 coupled with the configuration of the process chambers 106, 108 allow the length of the system 100 to be shortened without an increase in width provides a compact footprint and reduced cost of ownership.

The second passage 152 generally couples the first transfer area 122 and the first processing chamber 106 and is typically orientated parallel to the centerline 118 of the transfer chamber 104. The fourth passage 156 disposed between the second transfer area 124 and the second processing chamber 108 is similarly oriented parallel to the centerline 118. The pass through 158 couples the first and second transfer areas 122, 124 across the centerline 118. In one embodiment, the pass through 158 is positioned between the line 134 and second side 116 of the transfer chamber 104.

Generally, two transfer robots 142, 144 are utilized so that each processing chamber 106, 108 has a dedicated substrate transfer mechanism to ensure minimum dwell time between processing operations at each processing chamber. Additionally, having two transfer robots 142, 144 offers redundancy when substrates are processed in a parallel mode as the robots 142, 144 can feed both process chambers 106, 108 if only one of the load locks 110, 112 is operational. The first and second transfer robots 142, 144 may be of the dual or single blade variety. Double blade robots include robots having side-by-side and over-under blade configurations. The robots 142, 144 typically have a "frog-leg" linkage that is commonly used to transfer substrates in vacuum environments. One robot that may be used to advantage is a VHP® substrate transfer robot available from Applied Materials, Inc., located in Santa Clara, Calif. Other configurations for the transfer robot may also be used, such as, for example, a polar-type configuration. One example of a polar robot that may used to advantage is described in U.S. Pat. Ser. No. 09/547,189, filed Apr. 11, 2000 by Ettinger, et al., which is incorporated herein in its entirety.

Figure 4:
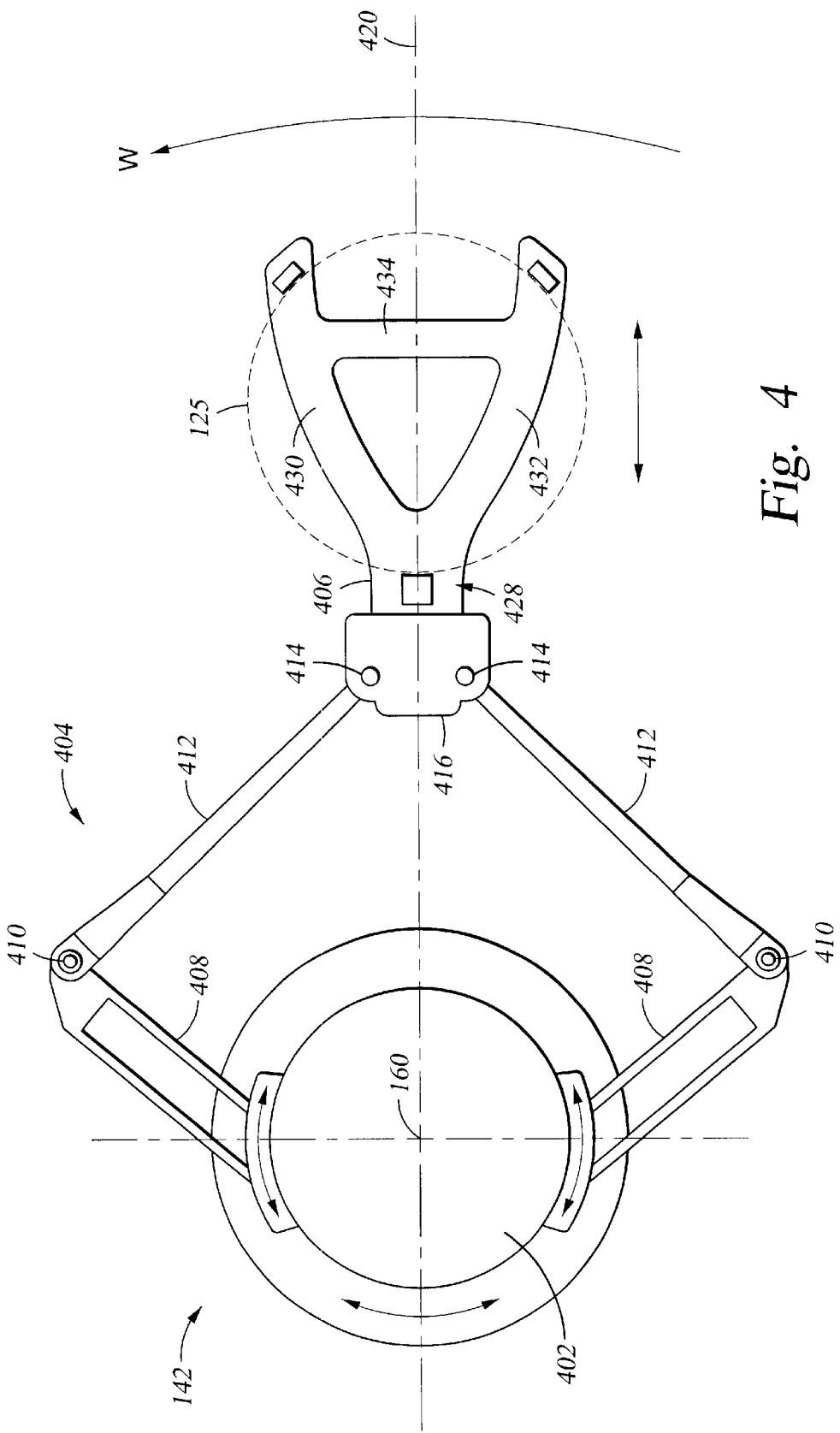
FIG. 4 is a plan view of one embodiment of a transfer robot.

FIG. 4 depicts one embodiment of a first transfer robot 142. The second transfer robot 144 may be similarly configured. The first transfer robot 142 generally comprises a robot body 402 that is coupled by a linkage 404 to an end effector 406 that supports a substrate 125 (shown in phantom) thereon. The end effector 406 may be configured to retain the substrate thereon in a desired manner, such as, for example, friction, electrostatically, vacuum chucking, clamping, edge gripping and the like.

The linkage 404 generally includes two wings 408 and two arms 412 coupled by elbows 410. Each wing 408 is additionally coupled to an electric motor (not shown) concentrically stacked within the robot body 402. Each arm 412 is coupled by a bushing 414 to a wrist 416. The bushings 414 are coupled by a gear or belt (not shown) to maintain the radial orientation of the end effector 406 independent of relative movement of each wing 408 and arms 412. The wrist 416 couples the linkage 404 to the end effector 406. Typically, the linkage 404 is fabricated from aluminum, however, other materials may also be utilized.

Each wing 408 is independently controlled by one of the concentrically stacked motors. When the motors rotate in the same direction, the end effector 406 is rotated at an angle o) about the center 160 of the robot body 402 at a constant radius. When both of the motors are rotated in opposite directions, the linkage 404 accordingly expands or contracts, thus moving the end effector 406 radially inward or outward along an imaginary line 420 passing through the center 160 of the first transfer robot 142. The first transfer robot 142 is also capable of a hybrid motion resulting from combining the radial and rotational motions simultaneously.

The end effector 406 is typically fabricated from aluminum, quartz, carbon, metal matrix or ceramic and configured to support a substrate with minimal sag. In the embodiment depicted in FIG. 4, the end effector 406 includes a base 428 having a first member 430 and a second member 432 extending therefrom. The base 428 is coupled to the wrist 416 of the first transfer robot 142. The first member 430 and the second member 432 are generally disposed in spaced-apart relation typically mirrored about the imaginary line 420. The length and spacing between the first member 430 and the second member 432 is selected to adequately support the substrate during transfer and typically supports the substrate at or near an edge. At least one connecting member 434 is coupled between the first member 430 and second member 432 to provide additional structural rigidity to the end effector 406.

Referring back to FIG. 1, a pumping port 170 is typically disposed through the transfer chamber 104 and coupled to a vacuum pumping system (not shown). In one embodiment, the pumping port 170 is disposed in the pass through 158. The central location of the pumping port 170 provides good conductance and assists in minimizing time required to pump down the transfer chamber 104 to a desired vacuum level. Additional and/or alternative positions of the pumping port 170 may be utilized.

A transfer platform 138 is typically disposed in the pass through 158 to facilitate transfer of substrates between the first transfer area 122 and the second transfer area 124. The transfer platform 138 may be stationary and include a plurality of cut-outs to allow the robots 142, 144 to place and retrieve substrates from the transfer platform 138. The transfer platform 138 is typically disposed on or near the center axis 118.

Figure 5:
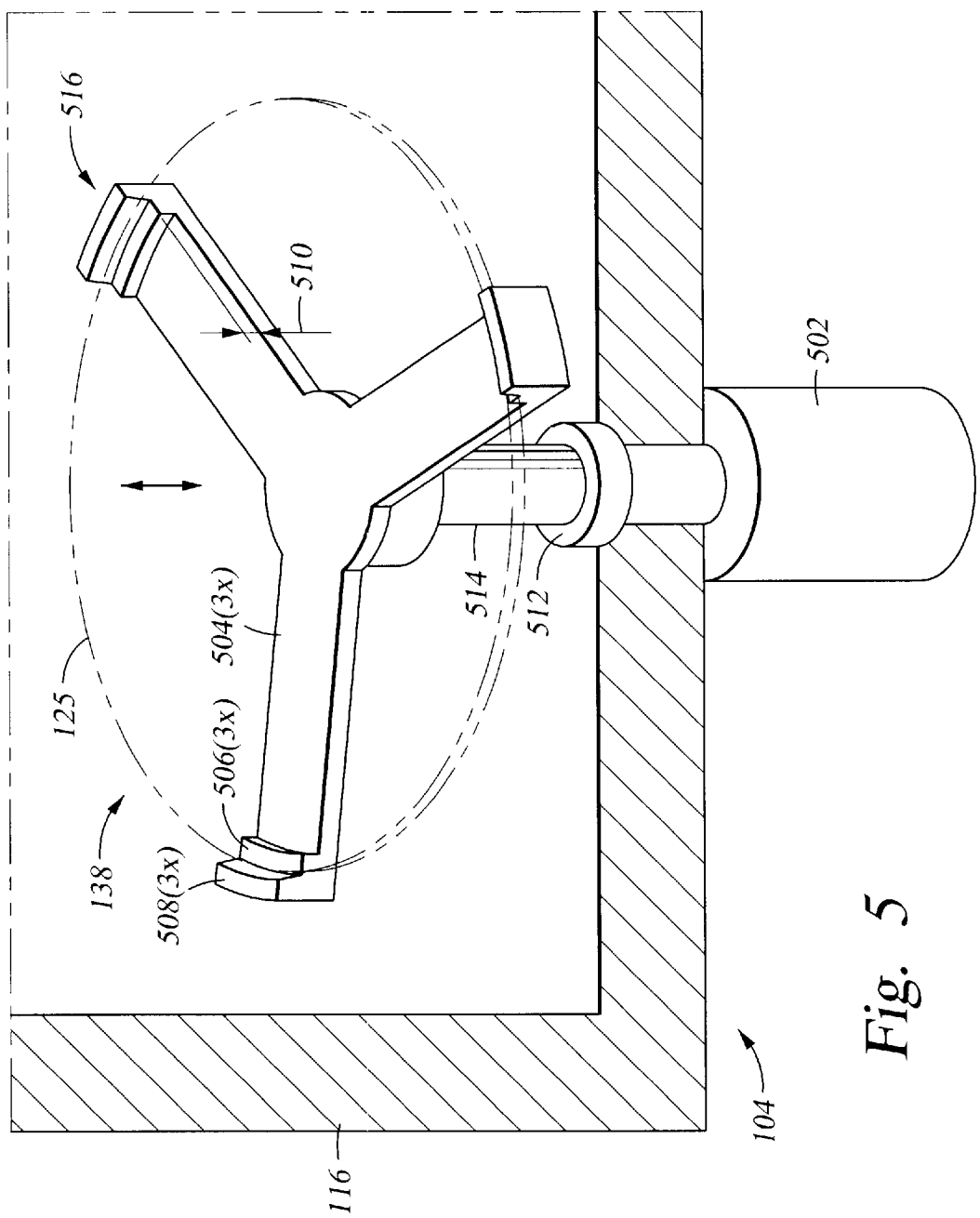
FIG. 5 is a perspective view of one embodiment of a transfer platform.

FIG. 5 depicts one embodiment of a transfer platform 138. The transfer platform 138 generally includes a support body 516 coupled to the transfer chamber 104 by a support member 514. The support member 514 is coupled to a lift mechanism 502 disposed on the exterior of the chamber 104. The lift mechanism 502 generally controls the elevation of the support body 516 to facilitate substrate 125 transfer with the first and second transfer robots 142, 144. A seal 512 generally prevents leakage around the support member 514. Alternatively, when using transfer robots having elevation capability, the elevation of the transfer platform 138 may be fixed.

The support body 516 includes a plurality of radially extending arms 504. The arms 504 are generally orientated to allow access to the substrate 125 seated on the transfer platform 138 by the transfer robots 142, 144 without contact the transfer platform 138. Each arm 504 includes a substrate support pad 506 adapted to support the substrate 125 a distance 510 above the arm 504 to allow entry and egress of the end effector 406 of the transfer robots between the substrate seated on the pad 506 and the arm 504. A retaining lip 508 circumscribes the outward edge of the pad 506. The circumscribing lip 508 generally centers and maintains the substrate seated on the transfer platform 138.

Figure 6:
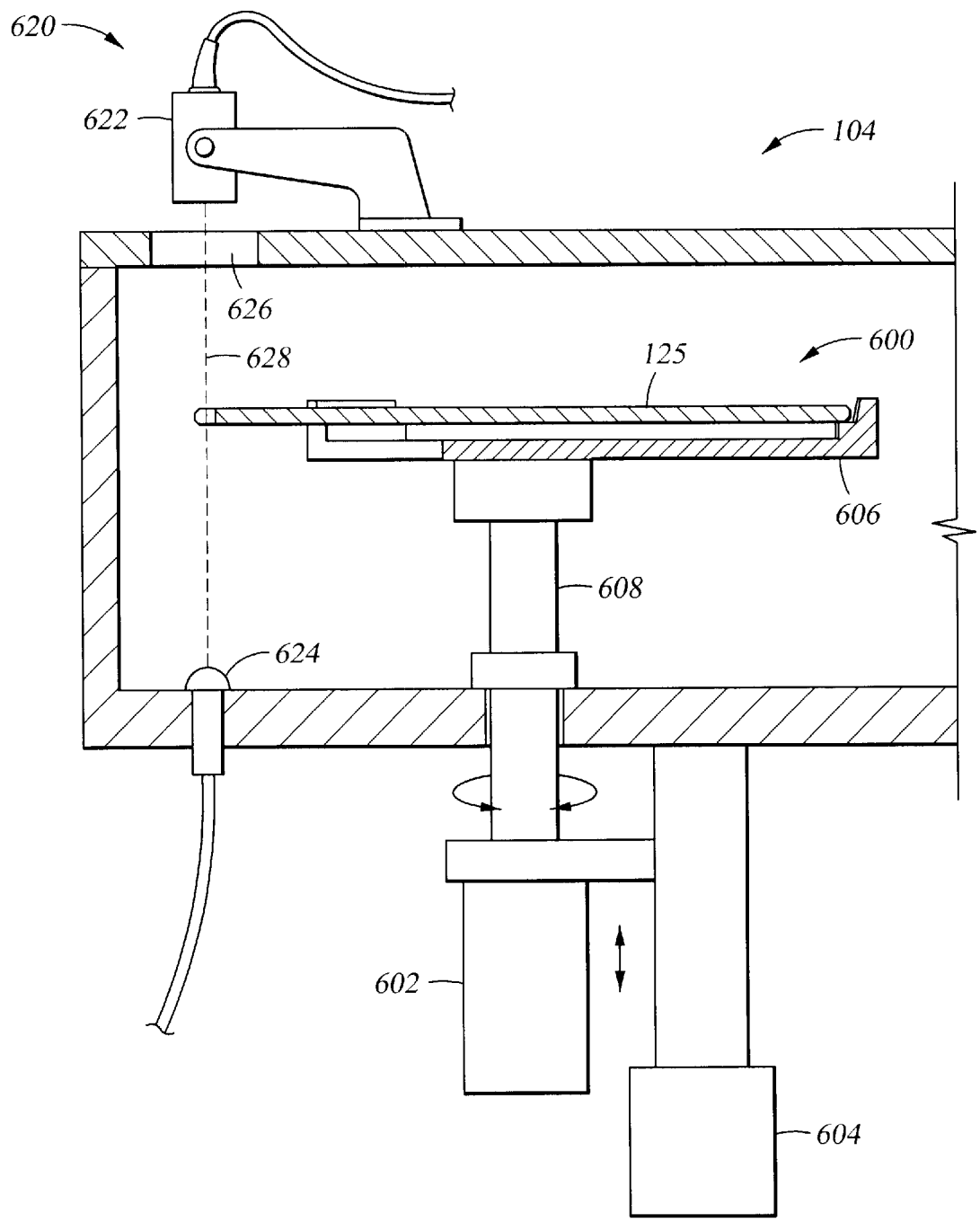
FIG. 6 is a sectional view of another embodiment of a transfer platform.

FIG. 6 depicts another embodiment of a transfer platform 600. The transfer platform 600 is generally similar to the transfer platform 138 described above except the transfer platform 600 is adapted to orientate the substrate 125. The transfer platform 600 includes a rotary actuator 602 and lift mechanism 604 which are adapted to control the elevation and angular orientation of the substrate 125 seated on the platform 600.

In the embodiment depicted in FIG. 6, a support member 608 is coupled to a support body 606 that retains the substrate 125. The rotary actuator 602 is coupled to the support member 608 thereby selectively allowing the support body 606 to be rotated about a central axis.

The lift mechanism 604 is coupled between the rotary actuator 602 and the chamber 104. The lift mechanism 604 moves the rotary actuator 602, support member 608 and body 602 to allow the transfer robots 142, 144 to place and retrieve substrates from the transfer platform 600.

A detection system 620 similar to the detection system 204 described above generally cooperates with the rotary actuator 602 to orientate the substrate 125. In one embodiment, the detection system 620 includes an emitter 622 and a receiver 624. The emitter 622 is typically positioned on the exterior of the transfer chamber 104 proximate a window 626 comprised of a material substantially transparent to a beam 628 generated by the emitter 622.

The receiver 624 is positioned on the floor of the transfer chamber 104 and typically communicates with a controller as described above to selectively rotate the transfer platform 600 to place the substrate 125 in a pre-determined rotational orientation.

The ability of the transfer platform 600 to rotate the substrate 125 advantageously allows the substrate 125 to maintain its angular orientation in each process chamber 106, 108, independent of the path through the transfer chamber 104. The ability to maintain the orientation of the substrate 125 within the system 100 allows identical process chambers to be utilized.

Returning to FIG. 1, the processing chambers 106, 108 are typically coupled to the second side 116 of the transfer chamber 104. A slit valve (not shown) selectively seals each processing chamber 106, 108 from the transfer chamber 104. Examples of processing chambers 106, 108 that may be utilized are etching chambers, physical vapor deposition chambers, chemical vapor deposition chambers, ion implantation chambers, lithography chambers and the like, all of which are available from Applied Materials, Inc, of Santa Clara, Calif.

The transfer platform 138 and twin robots 142, 144 provide versatile process sequencing which is advantageous for small scale substrate fabrication. For example, the processing chambers 106, 108 may be configured to perform different fabrication processes, for example, atomic layer deposition and bulk deposition thereby providing a processing sequence that forms a predefined structure, feature or layer upon the substrate's surface. Alternatively, the processing chambers 106, 108 may be configured to perform identical fabrication steps. The system 100 accordingly may be configured to perform parallel processing of the same or different processes. Alternatively, the system 100 may be configured to process substrates sequentially between the process chambers 106, 108. Additionally, the processing chambers 106, 108 may be configured for synchronized processing in a parallel mode using process chambers similar to those utilized in Producer™ Processing Systems.

Figure 7:
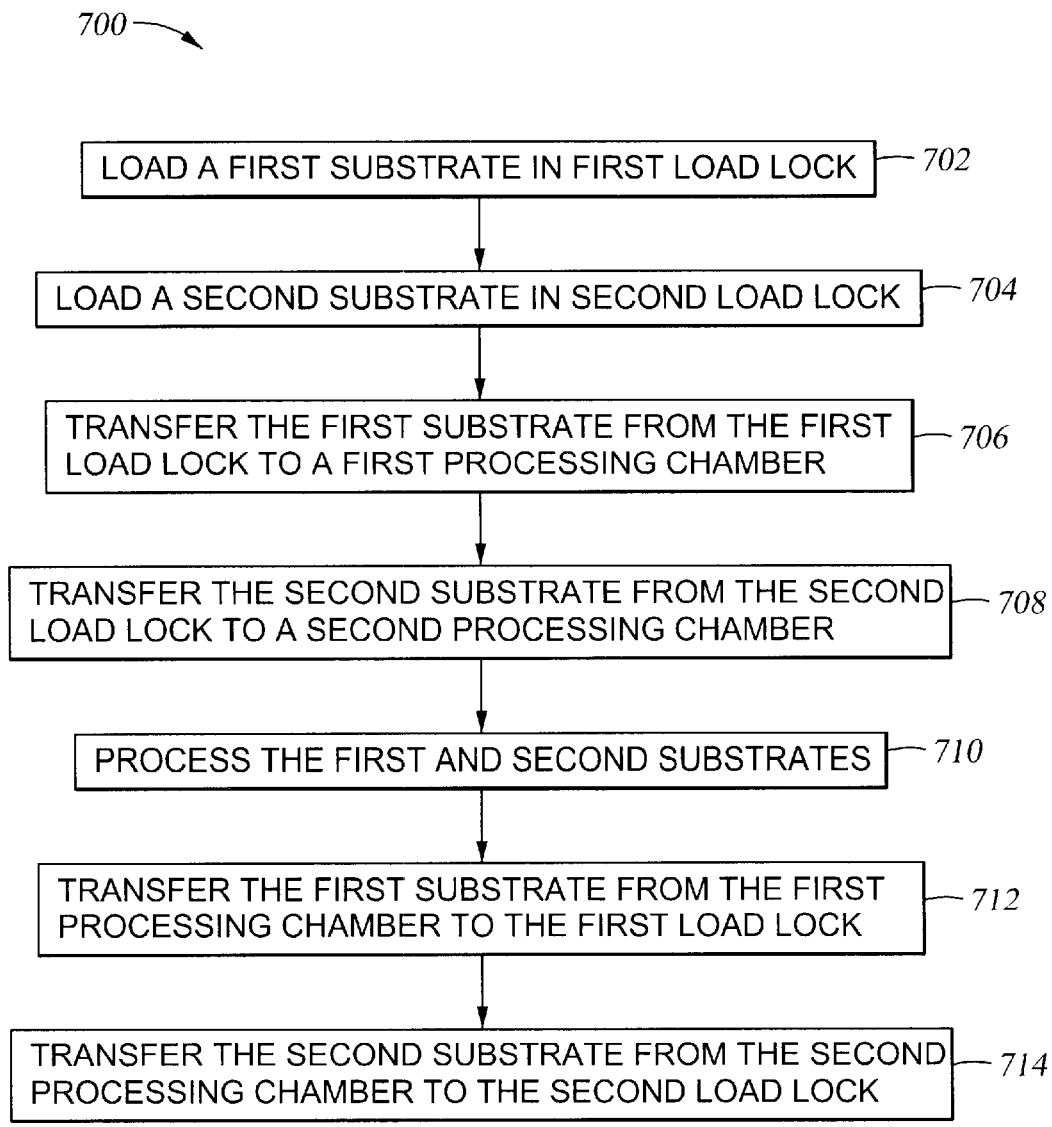
FIG. 7 is a flow diagram of one embodiment of a process sequence that may be practiced utilizing the processing system of FIG. 1.

FIG. 7 is a flow diagram of one embodiment of a process sequence 700 that may be practiced utilizing the processing chamber 100. The process sequence 700 generally allows for parallel processing of multiple substrates in the process chambers 106, 108. Generally, the process sequence begins with the transfer of a first substrate into the first load lock 110 at step 702. Next at step 704, a second substrate into the second load lock 112. The first transfer robot 142 then transfers the first substrate to the first process chamber 106 at step 706. The second transfer robot 144 then transfers the second substrate to the second process chamber 108 at step 708. The transfer robots 142, 144 may be synchronized to provide substantially simultaneous processing of substrates within the process chambers 106, 108. The first and second substrate are then processed in the process chambers 106, 108 at step 710. Typically, a deposition process is performed.

After processing, the first transfer robot 142 transfers the first substrate back to the first load lock chamber 110 at step 712. Likewise, the second transfer robot 144 transfers the second substrate back to the second load lock chamber 112 at step 714.

Figure 8:
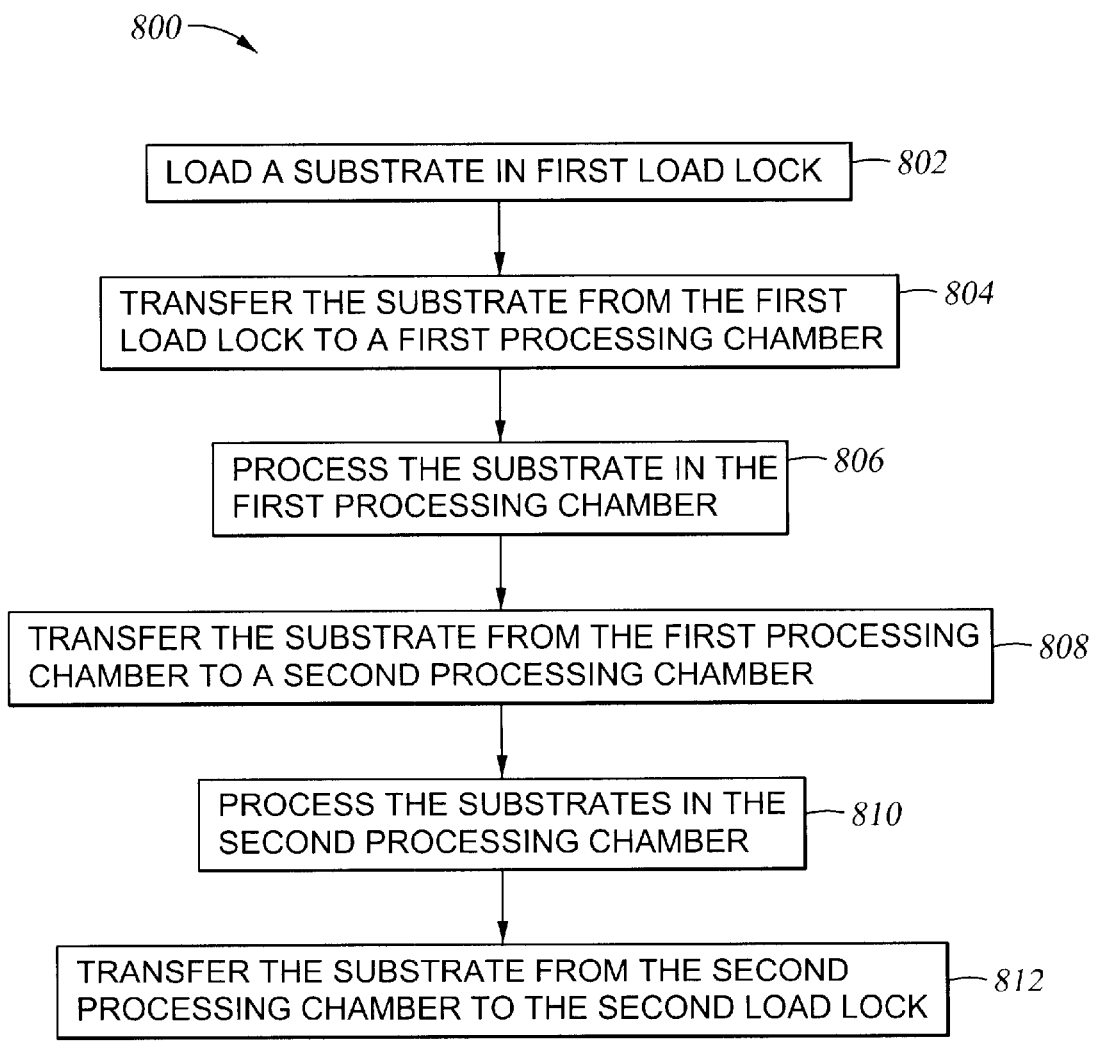
FIG. 8 is a flow diagram of another embodiment of a process sequence that may be practiced utilizing the processing system of FIG. 1.

FIG. 8 is a flow diagram of another embodiment of a process sequence 800 that may be practiced utilizing the processing chamber 100. The process sequence 800 generally allows for sequential processing of substrates through the process chambers 106, 108. Generally, the process sequence begins with the transfer of a substrate into the first load lock 110 at step 802. Next at step 804, the first transfer robot 142 transfers the substrate to the first process chamber 106. The substrate is then processed in the first processing chamber 106 at step 806.

In one embodiment of the sequence 800, an atomic layer deposition is performed on the substrate at step 806. For example, a nucleation layer of tungsten or a layer of metal nitrides, among other materials, may be deposited using processes described in U.S. Patent Application No. 60/305,646, filed Jul. 16, 2001; Ser. No. 09/605,593, filed Jun. 28, 2000; and Ser. No. 09/754,230, filed Jan. 3, 2001, all of which are hereby incorporated by reference in their entireties.

After the substrate has been processed in the first chamber 106, the substrate is transferred to the second process chamber 108 at step 808. Step 808 generally includes transferring the substrate between the first and second transfer robot 142, 144 using a transfer platform 138. The substrate may additionally be orientated using the transfer platform 138 as described above. The second transfer robot 144 then transfers the substrate to the second process chamber 108. At step 810, the substrate is processed in the second process chamber 106. Typically, a deposition process is performed, for example, a bulk tungsten deposition such as described in the previously incorporated U.S. Patent Application No. 60/305,646 and Ser. No. 09/605,593. Other processes may alternatively be performed. After processing, the substrate is transferred from the second process chamber 108 to the second load lock 112 at step 812.

Although the teachings of the present invention that have been shown and described in detail herein, those skilled in the art can readily devise other varied embodiments that still incorporate the teachings and do not depart from the scope and spirit of the invention.

What is claimed is:

1. A substrate processing system comprising:
    a transfer chamber comprising:
        a body;
        a first transfer area defined within the body;
        a second transfer area defined within the body and separated from the first transfer area by a center axis of the body;
        a first passage coupling a first side of the body and the first transfer area; and
        a second passage coupling the first side of the body and the second transfer area, the first passage and the second passage forming an acute angle about the center axis;
    a transfer platform disposed between the first transfer area and the second transfer area;
    a first load lock chamber fluidly coupled to the first passage;
    a second load lock chamber fluidly coupled to the second passage;
    a first processing chamber coupled to a second side of the transfer chamber;
    a second processing chamber coupled to the second side of the transfer chamber on a side of the center axis opposite the first processing chamber;
    a first transfer robot disposed in the first transfer area and adapted to transfer substrates between the first load lock, the transfer platform and the first processing chamber; and
    a second transfer robot disposed in the second transfer area and adapted to transfer substrates between the second load lock, the transfer platform and the second processing chamber.

2. The processing system of claim 1, wherein the first transfer robot and the second transfer robot are aligned along a line perpendicular to the center axis.

3. The processing system of claim 2, wherein the transfer platform is disposed between the transfer robots and the second side of the transfer chamber.

4. The processing system of claim 1, wherein the transfer platform is located on the center axis.

5. The processing system of claim 1, wherein the transfer chamber further comprises an interior wall separating the first transfer area from the second transfer area.

6. The processing system of claim 5, wherein the interior wall further comprises a pass through having a pumping port positioned therein.

7. The processing system of claim 1 further comprising:
a factory interface coupled to the first and the second load lock chambers.

8. The processing system of claim 7, wherein the factory interface further comprises an enclosure, a transfer robot disposed in the enclosure and a plurality of bays, each adapted to accept a substrate storage cassette.

9. The processing system of claim 8, wherein the interface robot is movably disposed on a rail positioned in the enclosure.

10. The processing system of claim 1, wherein the first load lock chamber further comprises a substrate support hoop movably disposed therein having two vertically stacked substrate receiving slots.

11. The processing system of claim 1, wherein the first processing chamber is a chemical vapor deposition chamber.

12. The processing system of claim 1, wherein the first processing chamber is an atomic layer deposition chamber.

13. The processing system of claim 1, wherein the transfer platform is fixed in a stationary position.

14. The processing system of claim 1, wherein the transfer platform is coupled to a lift mechanism.

15. The processing system of claim 1, wherein the transfer platform rotates.

16. The processing system of claim 1, wherein the transfer platform further comprises a substrate support rotatably coupled to a lift mechanism.

17. The processing system of claim 1, wherein the transfer platform is symmetrical about the center axis.

18. A substrate processing system comprising:
a transfer chamber comprising:
  a body;
  a first transfer area defined within the body;
  a second transfer area defined within the body and separated from the first transfer area by a center axis of the body;
  a first passage coupling a first side of the body and the first transfer area; and
  a second passage coupling the first side of the body and the second transfer area;
a transfer platform disposed between the first transfer area and the second transfer area, the transfer platform comprising:
  a rotatable support surface adapted to support a substrate; and
  a support member having the support surface disposed thereon;
a first load lock chamber fluidly coupled to the first passage;
a second load lock chamber fluidly coupled to the second passage;
a first processing chamber coupled to the transfer chamber;
a second processing chamber coupled to the transfer chamber on a side of the center axis opposite the first processing chamber;
a first transfer robot disposed in the first transfer area and adapted to transfer substrates between the first load lock, the transfer platform and the first processing chamber; and
a second transfer robot disposed in the second transfer area and adapted to transfer substrates between the second load lock, the transfer platform and the second processing chamber.

19. The processing system of claim 18, wherein the first transfer robot and the second transfer robot are aligned along a line perpendicular to the center axis.

20. The processing system of claim 19, wherein the transfer platform is disposed between the transfer robots and the second side.

21. The processing system of claim 18, wherein the transfer platform is disposed on the center axis.

22. The processing system of claim 18, wherein the transfer chamber further comprises an interior wall separating the first transfer area from the second transfer area.

23. The processing system of claim 22, wherein the interior wall further comprises a pass through having the transfer platform disposed therein.

24. The processing system of claim 18 further comprising:
a factory interface coupled to the first and the second load lock chambers.

25. The processing system of claim 24, wherein the factory interface further comprises a transfer robot and a plurality of substrate storage cassettes.

26. The processing system of claim 25, wherein the interface robot is movably disposed on a rail orientated perpendicular to the center axis.

27. The processing system of claim 18, wherein the first load lock chamber further comprises a substrate support hoop movably disposed therein having two vertically stacked substrate receiving slots.

28. The processing system of claim 18, wherein the first processing chamber is a chemical vapor deposition chamber.

29. The processing system of claim 18, wherein the first processing chamber is an atomic layer deposition chamber.

30. The processing system of claim 18, wherein the transfer platform is coupled to a lift mechanism.

31. The processing system of claim 18, wherein the transfer platform further comprises:
a plurality of lift pins;
a lift plate selectively disposed between the lift pins and a bottom of the transfer chamber; and
a lift mechanism coupled to the lift plate.

32. The processing system of claim 18, wherein the first passage and the second passage of the transfer chamber form an acute angle about the center axis.

33. The processing system of claim 18, wherein the transfer platform is symmetrical about the center axis.

34. A substrate processing system comprising:
a transfer chamber comprising:
  a body;
  a first transfer area defined within the body;
  a second transfer area defined within the body and separated from the first transfer area by a center axis of the body;
  a first passage coupling a first side of the body and the first transfer area; and
  a second passage coupling the first side of the body and the second transfer area;
a transfer platform disposed between the first transfer area and the second transfer area, the transfer platform comprising:
  a rotatable support surface adapted to support a substrate;

a plurality of lift pins;
a lift plate selectively contacting the lift pins;
a support member having the support surface disposed thereon; and
a lift mechanism coupled to the support member or lift plate actuatable between a first position and a second position that moves the lift pins relative to the support surface;
a first load lock chamber fluidly coupled to the first passage;
a second load lock chamber fluidly coupled to the second passage;
a first processing chamber coupled to the transfer chamber;
a second processing chamber coupled to the transfer chamber on a side of the center axis opposite the first processing chamber;
a first transfer robot disposed in the first transfer area and adapted to transfer substrates between the first load lock, the transfer platform and the first processing chamber; and
a second transfer robot disposed in the second transfer area and adapted to transfer substrates between the second load lock, the transfer platform and the second processing chamber.

35. The processing system of claim 34, wherein the first passage and the second passage of the transfer chamber form an acute angle about the center axis.

36. A substrate processing system comprising:
a transfer chamber comprising:
a body;
a first transfer area defined within the body;
a second transfer area defined within the body and separated from the first transfer area by a center axis of the body;
a first passage coupling a first side of the body and the first transfer area; and
a second passage coupling the first side of the body and the second transfer area, the first passage and the second passage forming an acute angle about the center axis;
a transfer platform disposed on the center axis between the first transfer area and the second transfer area;
a first load lock chamber fluidly coupled to the first passage;
a second load lock chamber fluidly coupled to the second passage;
a first processing chamber coupled to the transfer chamber;
a second processing chamber coupled to the transfer chamber on a side of the center axis opposite the first processing chamber;
a first transfer robot disposed in the first transfer area and adapted to transfer substrates between the first load lock, the transfer platform and the first processing chamber; and
a second transfer robot disposed in the second transfer area and adapted to transfer substrates between the second load lock, the transfer platform and the second processing chamber, the second transfer robot and the first transfer robot aligned along a line perpendicular to the center axis.

37. The processing system of claim 36, wherein the transfer chamber further comprises:
an interior wall separating the first transfer area from the second transfer area; and
a pass through disposed through the interior wall and having the transfer platform disposed therein.

38. The processing system of claim 36 further comprising:
a factory interface coupled to the first and the second load lock chambers.

39. The processing system of claim 38, wherein the factory interface further comprises a transfer robot and a plurality of substrate storage cassettes.

40. The processing system of claim 39, wherein the interface robot is movably disposed on a rail orientated perpendicular to the center axis.

41. The processing system of claim 36, wherein the first load lock chamber further comprises a substrate support hoop movably disposed therein having two vertically stacked substrate receiving slots.

42. The processing system of claim 36, wherein the first processing chamber is a chemical vapor deposition chamber.

43. The processing system of claim 36, wherein the first processing chamber is an atomic layer deposition chamber.

44. The processing system of claim 36, wherein the transfer platform or a support surface disposed thereon rotates.

45. A substrate processing system comprising:
a transfer chamber comprising:
a body;
a first transfer area defined within the body;
a second transfer area defined within the body and separated from the first transfer area by a center axis of the body;
a first passage coupling a first side of the body and the first transfer area; and
a second passage coupling the first side of the body and the second transfer area, the first passage and the second passage forming an acute angle about the center axis;
a transfer platform disposed between the first transfer area and the second transfer area, the transfer platform comprising:
a rotatable support surface adapted to support a substrate;
a plurality of lift pins;
a lift plate selectively contacting the lift pins;
a support member having the support surface disposed thereon; and
a lift mechanism coupled to the support member or lift plate actuatable between a first position and a second position that moves the lift pins relative to the support surface;
a first load lock chamber fluidly coupled to the first passage;
a second load lock chamber fluidly coupled to the second passage;
a first processing chamber coupled to the transfer chamber;
a second processing chamber coupled to the transfer chamber on a side of the center axis opposite the first processing chamber;
a first transfer robot disposed in the first transfer area and adapted to transfer substrates between the first load lock, the transfer platform and the first processing chamber; and
a second transfer robot disposed in the second transfer area and adapted to transfer substrates between the second load lock, the transfer platform and the second processing chamber, the second transfer robot and the first transfer robot aligned along a line perpendicular to the center axis.

* * * * *